(12) United States Patent
Wu

(10) Patent No.: US 7,808,296 B2
(45) Date of Patent: Oct. 5, 2010

(54) IMAGE DISPLAY SYSTEM

(75) Inventor: Tse-Hung Wu, Yonghe (TW)

(73) Assignee: TPO Displays Corp., Chu-Nan, Miao-Li County (TW)

( * ) Notice: Subject to any disclaimer, the term of this patent is extended or adjusted under 35 U.S.C. 154(b) by 40 days.

(21) Appl. No.: 12/352,853

(22) Filed: Jan. 13, 2009

(65) Prior Publication Data

US 2009/0179683 A1    Jul. 16, 2009

(30) Foreign Application Priority Data

Jan. 14, 2008    (TW) ............................. 97101367 A

(51) Int. Cl.
*H03L 5/00* (2006.01)
(52) U.S. Cl. ............................. 327/333; 326/62; 326/81
(58) Field of Classification Search ............. 326/62–63, 326/80–81; 327/333, 306
See application file for complete search history.

(56) References Cited

U.S. PATENT DOCUMENTS

| 5,748,026 | A | 5/1998 | Maekawa et al. |
| 6,157,361 | A * | 12/2000 | Kubota et al. ............... 345/100 |
| 6,838,924 | B1 * | 1/2005 | Davies, Jr. .................. 327/333 |
| 7,667,522 | B1 * | 2/2010 | Maung ....................... 327/333 |

\* cited by examiner

*Primary Examiner*—Dinh T. Le
(74) *Attorney, Agent, or Firm*—Tim Tingkang Xia; Morris, Manning & Martin LLP

(57) ABSTRACT

An image display system is provided. The image display system includes a level shifter including a first voltage adjusting circuit and a second voltage adjusting circuit. The first voltage adjusting circuit adjusting the voltage of an input signal, includes a small signal input terminal receiving the input signal and a differential output terminal outputting a pair of differential signals. The available voltage ranges of the differential signals are larger than that of the input signal. The second voltage adjusting circuit, coupled to the first voltage adjusting circuit, includes a first input terminal and a second input terminal respectively receiving the pair of differential signals. The second adjusting circuit adjusts the voltage of the differential signals and generates an output signal. The available voltage range of the output signal is larger than that of the differential signals.

19 Claims, 11 Drawing Sheets

IMAGE DISPLAY SYSTEM

CROSS REFERENCE TO RELATED APPLICATIONS

This Application claims priority of Taiwan Patent Application No. 097101367, filed on Jan. 14, 2008, the entirety of which is incorporated by reference herein.

BACKGROUND OF THE INVENTION

1. Field of the Invention

The invention relates to a level shifter circuit, and more particularly to a level shifter circuit capable of receiving high frequency and low voltage input signals.

2. Description of the Related Art

A level shifter circuit is generally configured to convert signals between two different voltage levels. For example, the level shifter is used to convert the low voltage of an input signal to a higher voltage that may be preferably used for the circuit with higher operating voltage.

FIG. 1 shows a circuit diagram of conventional digital level shifter 10. The conventional level shifter 10 consists of two NMOS transistors 103A and 103B, two PMOS transistors 104A and 104B, and three inverters 101, 102A and 102B, wherein the voltage level of the input signal $S_{IN}$ is lower than that of the voltage supplier $V_{DD}$. When the input signal $S_{IN}$ is a high voltage signal to turn on the NMOS transistor 103A, the voltage at node X is pulled down to $V_{SS}$ due to the turned on NMOS transistor 103A. The low voltage $V_{SS}$ at node X further turns on the PMOS transistor 104B and the voltage at node Y is pulled high to $V_{DD}$. After buffered by inverters 102A and 102B, the voltage of output signal $S_{OUT}$ is pulled high to $V_{DD}$. Contrarily, when the input signal $S_{IN}$ is a low voltage signal that is unable to turn on the NMOS transistor 103A, the low voltage signal will be inverted by the inverter 101 to become a high voltage signal capable of turning on the NMOS transistor 103B, and the voltage at node Y is then pulled down to $V_{SS}$ due to the turned on NMOS transistor 103B. After buffered by inverters 102A and 102B, the voltage of output signal $S_{OUT}$ is pulled down to $V_{SS}$.

However, when the input signal $S_{IN}$ is a high frequency and low voltage signal, the low voltage causes the current flowing through the NMOS transistor 103A to be small when the NMOS transistor 103A is turned on. Thus, it takes more time to pull the node X down to $V_{SS}$, and causes the response time of the level shifter to increase. For example, when the input signal $S_{IN}$ is a 5 MHz Master Clock (MCK) signal, since the response time at node X exceeds 200 ns, it is not fast enough to respond to the voltage variation of the MCK signal and the voltage level of the output signal $S_{OUT}$ is unable to be accordingly changed. Thus, the level shifting function fails. If the conducting current of the NMOS transistor 103A is increased by enlarging the width of the NMOS transistor so as to increase the response speed of the high frequency and low voltage input signal, the circuit area of the level shifter 10 will become too large and not be suitable for mass usage.

Thus, a novel level shifter circuit capable of receiving high frequency and low voltage input signals is highly desired.

BRIEF SUMMARY OF THE INVENTION

Image display systems are provided. An exemplary embodiment of an image display system comprises a level shifter including a first voltage adjusting circuit and a second voltage adjusting circuit. The first voltage adjusting circuit, adjusting the voltage of an input signal, comprises a small signal input terminal receiving the input signal and a differential output terminal outputting a pair of differential signals. The available voltage ranges of the differential signals are larger than that of the input signal. The second voltage adjusting circuit, coupled to the first voltage adjusting circuit, comprises a first input terminal and a second input terminal respectively receiving the pair of differential signals. The second adjusting circuit adjusts the voltage of the differential signals and generates an output signal. The available voltage range of the output signal is larger than that of the differential signals.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
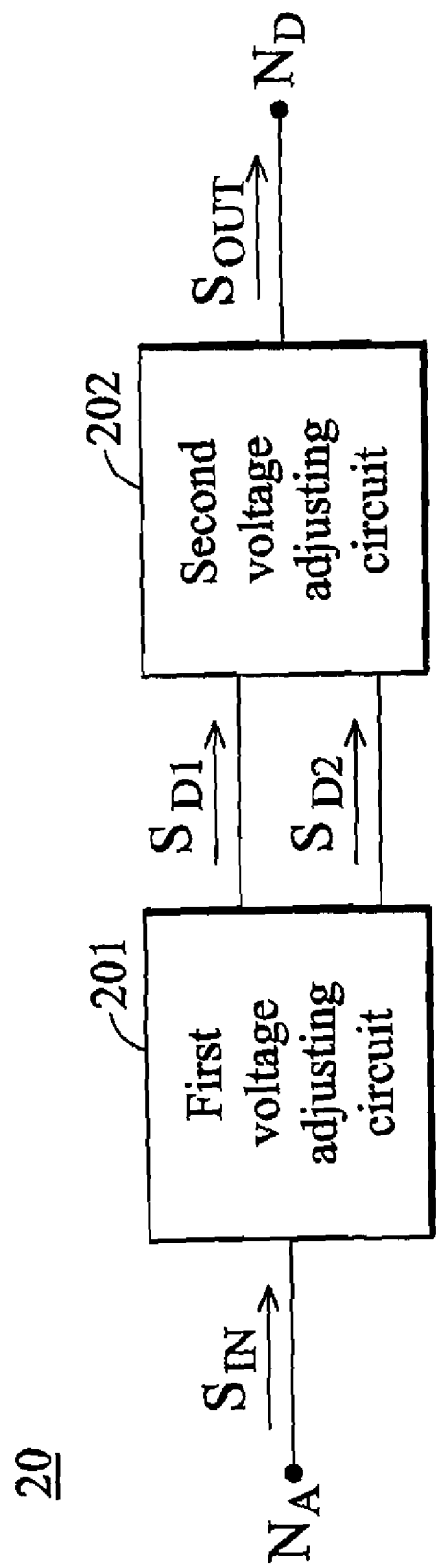
FIG. 2 shows a circuit diagram of a level shifter according to an embodiment of the invention.

FIG. 2 shows a circuit diagram of a level shifter 20 according to an embodiment of the invention. The level shifter 20 comprises a first voltage adjusting circuit 201 and a second voltage adjusting circuit 202. The first voltage adjusting circuit 201 adjusts the voltage of an input signal $S_{IN}$ and comprises a small signal input terminal $N_A$ receiving the input signal $S_{IN}$ and a pair of differential output terminals for outputting a pair of differential signals $S_{D1}$ and $S_{D2}$. The available voltage ranges of the differential signals $S_{D1}$ and $S_{D2}$ are larger than that of the input signal $S_{IN}$. The second voltage adjusting circuit 202 is coupled to the first voltage adjusting circuit 201 and comprises two input terminals for respectively receiving the pair of differential signals $S_{D1}$ and $S_{D2}$. The second voltage adjusting circuit 202 adjusts the voltages of the differential signals $S_{D1}$ and $S_{D2}$ and generates an output signal $S_{OUT}$. An available voltage range of the output signal $S_{OUT}$ is larger than that of the differential signals $S_{D1}$ and $S_{D2}$. According to an embodiment of the invention, the input signal $S_{IN}$ may be a high frequency and low voltage signal with 0V-1.4V available voltage range. The first voltage adjusting circuit 201 adjusts the voltage of the input signal $S_{IN}$ to a middle voltage so that the available voltage ranges of the output differential signals $S_{D1}$ and $S_{D2}$ are about 0V-4V. The second voltage adjusting circuit 202 further adjusts the voltage of the differential signals $S_{D1}$ and $S_{D2}$ so that the available voltage ranges of the output signal $S_{OUT}$ is about 0V-5V.

Figure 3:
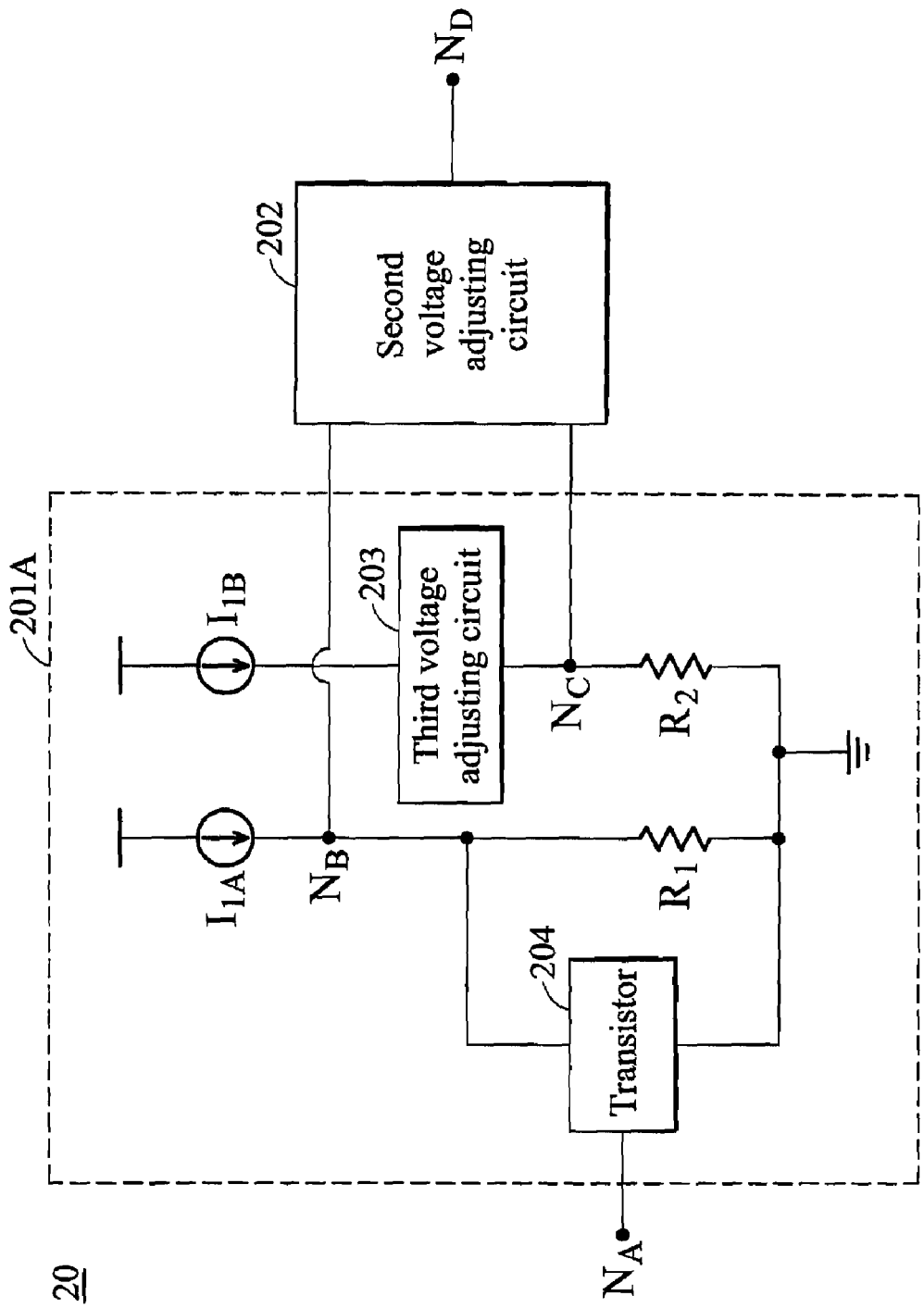
FIG. 3 shows a level shifter of the first voltage adjusting circuit of FIG. 2 according to a first embodiment of the invention

FIG. 3 shows a level shifter of the first voltage adjusting circuit of FIG. 2 according to a first embodiment of the invention. The first voltage adjusting circuit 201A comprises two current sources $I_{1A}$ and $I_{1B}$, a third voltage adjusting circuit 203, two resistors $R_1$ and $R_2$, and a transistor 204. The third voltage adjusting circuit 203 is connected to the current source $I_{1B}$ for providing a voltage difference. The resistor $R_1$ is coupled between the current source $I_{1A}$ and a ground. The second resistor $R_2$ is coupled between the third voltage adjusting circuit 203 and the ground. The transistor 204 is coupled between the current source $I_{1A}$, the small signal input terminal $N_A$, the resistor $R_1$ and the ground for receiving the input signal $S_{IN}$.

Figure 4:
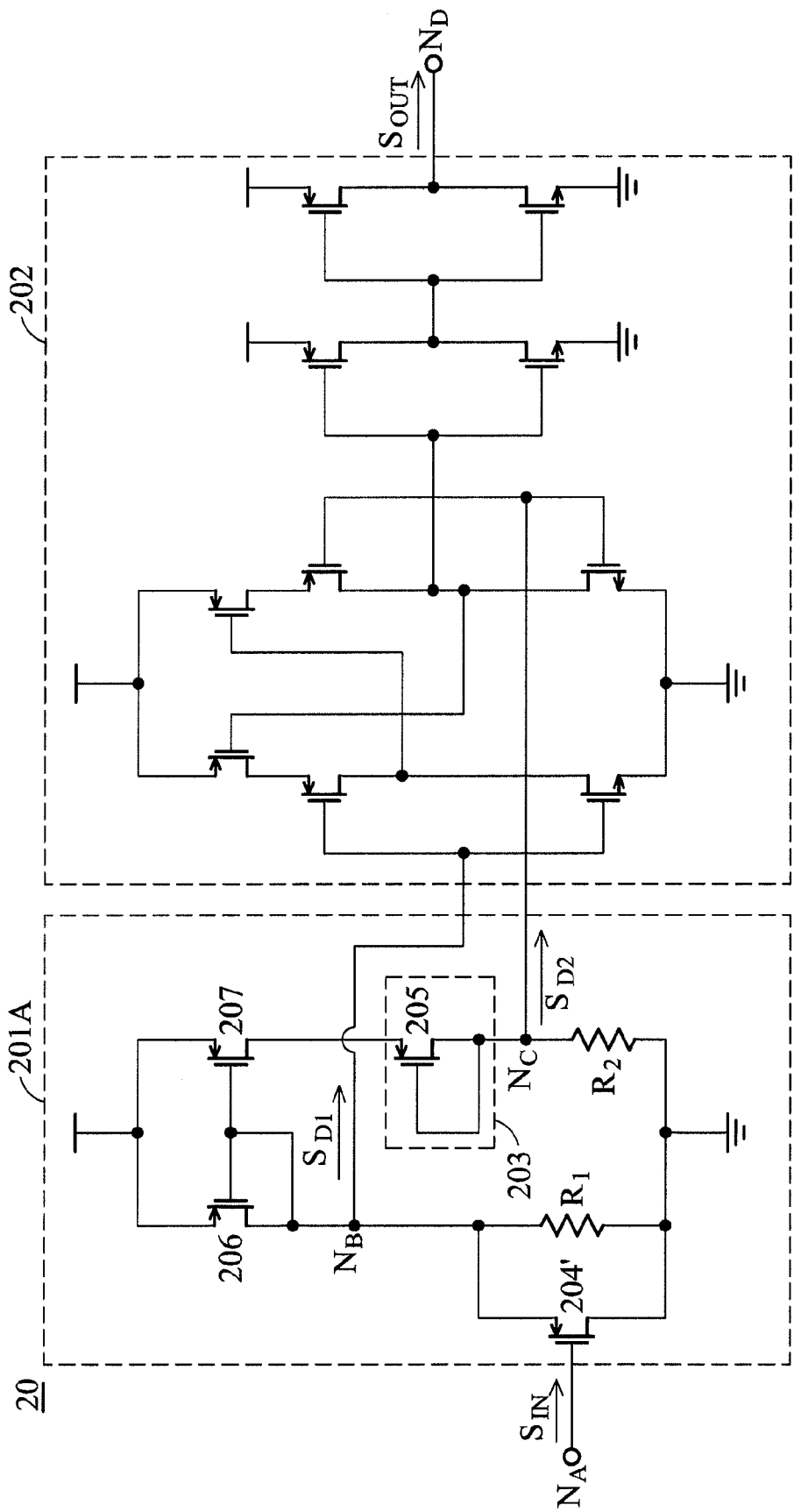
FIG. 4 shows a circuit diagram of a level shifter with the detailed circuit structure of the first voltage adjusting circuit and the second voltage adjusting circuit according to FIG. 3.

FIG. 4 shows a circuit diagram of a level shifter with the detailed circuit structure of the first voltage adjusting circuit 201A and the second voltage adjusting circuit 202 according to FIG. 3. According to the first embodiment of the invention, the transistor 204' may be a PMOS (P type metal oxide semiconductor) transistor, wherein a gate is connected to the small signal input terminal $N_A$ for receiving the input signal $S_{IN}$, a source is connected to a connection node $N_B$ of the current source $I_{1A}$ (referring to FIG. 3) and the resistor $R_1$, and a drain is connected to the ground. Also, according to the first embodiment of the invention, the third voltage adjusting circuit 203 may be a PMOS transistor 205, wherein a gate of the PMOS transistor 205 is connected to a drain of the PMOS transistor 205 for providing a voltage difference between the drain and the source of the PMOS transistor 205. However, according to the other embodiments of the invention, the third voltage adjusting circuit 203 may also be a diode or an NMOS transistor with a gate connected to a drain for providing a voltage difference between two terminals of the third voltage adjusting circuit 203.

Please both referring FIG. 3 and FIG. 4. In this embodiment, the current sources $I_{1A}$ and $I_{1B}$ form a current mirror as shown in FIG. 4, wherein the current source $I_{1A}$ may be a PMOS transistor 206, the current source $I_{1B}$ may be a PMOS transistor 207, and wherein a gate of the transistor 206 is coupled to a gate of the transistor 207, and the gate of the transistor 206 is further coupled to a drain of the transistor 206 to form the current mirror. The current mirror formed by transistors 206 and 207 may generate the same or different amounts of currents which are respectively supplied to the resistor $R_1$ and the third voltage adjusting circuit 203 according to the size of the transistors.

Two nodes $N_B$ and $N_C$ of the first voltage adjusting circuit 201A may be used to output the pair of differential signals $S_{D1}$ and $S_{D2}$, and two input terminals of the second voltage adjusting circuit 202 may be respectively connected to the nodes $N_B$ and $N_C$ for receiving the differential signals $S_{D1}$ and $S_{D2}$. The second voltage adjusting circuit 202 may be a level shifter for receiving medium/high voltage (about 0V-4V) input signals and further adjusting the voltages of the received differential signals such that the available voltage range of the output signal may be about 0V-5V.

According to the embodiment, the first voltage adjusting circuit 201A may be an analog voltage adjusting circuit, where the transistors in the first voltage adjusting circuit 201A may be operated in saturation so that the first voltage adjusting circuit 201A may be used for receiving high frequency and low voltage input signals. Since the transistor 204 is designed as a common drain, the voltage at node $N_B$ varies with the small input signal $S_{IN}$ received at node $N_A$. According to the common source design of transistor 207 and the voltage difference provided by the third voltage adjusting circuit 203, when the input signal $S_{IN}$ is at logic high voltage (about 1.4V), the voltage at node $N_B$ may be raised to a logic high voltage to about 4V, and the voltage at node $N_C$ may be leveled down to a logic low voltage to about 0V. The transistor 206 here may be configured to provide DC bias and a corresponding current. When the input signal $S_{IN}$ is at logic low voltage (about 0V), the voltage at node $N_B$ may be leveled down to a logic low voltage to about 0V, and the voltage at node $N_C$ may be raised to a logic high voltage to about 4V. Thus, the nodes $N_B$ and $N_C$ may output a pair of differential signals $S_{D1}$ and $S_{D2}$ at a medium voltage range (about 0V-4V). And the differential signals $S_{D1}$ and $S_{D2}$ may be further input to the second voltage adjusting circuit 202 and level shifted by the voltage adjusting circuit 202 so that the available voltage range of the output signal $S_{OUT}$ may be adjusted to about 0V-5V.

Figure 5:
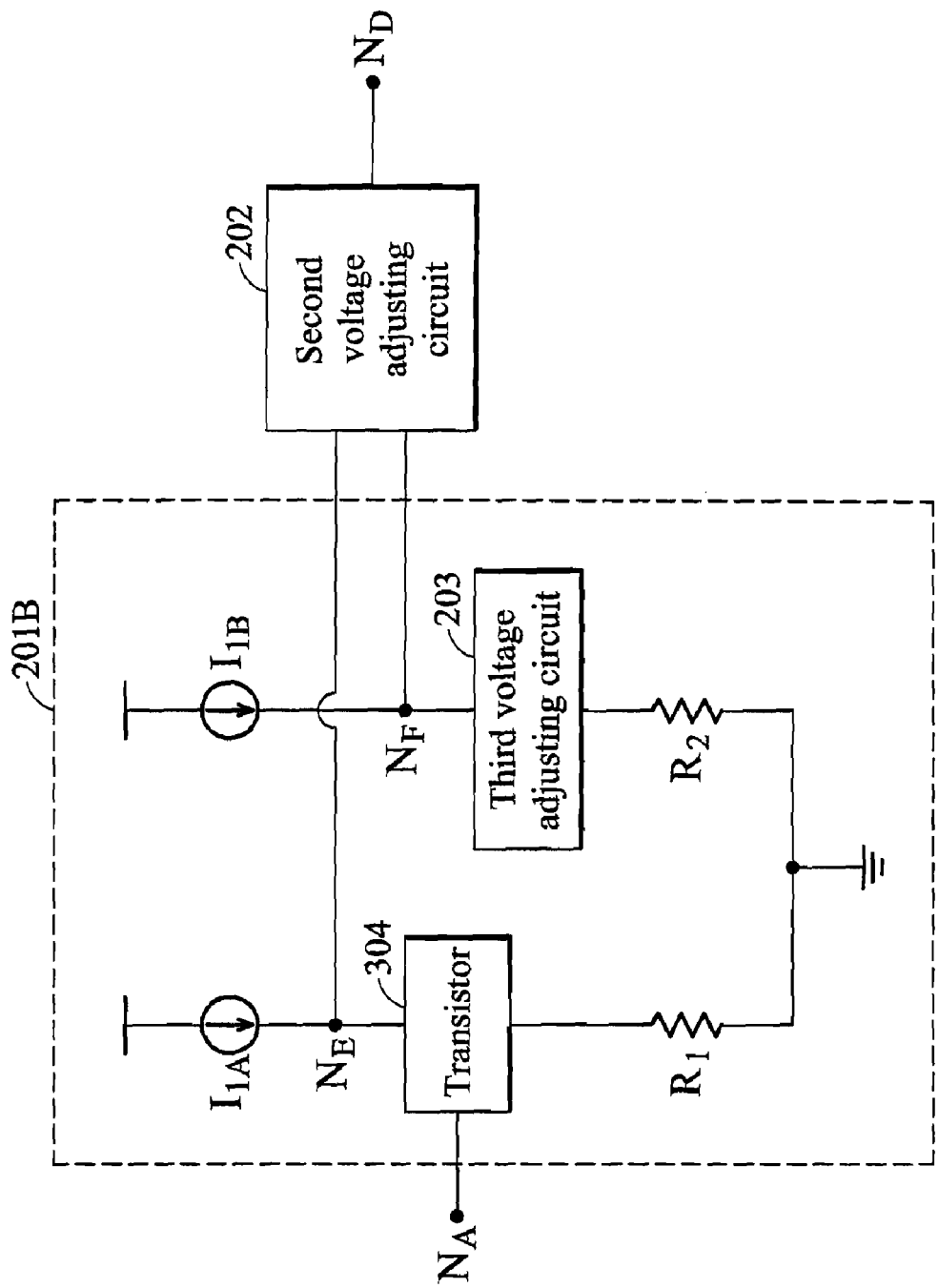
FIG. 5 shows a circuit diagram of a first voltage adjusting circuit of FIG. 2 according to second embodiment.
Figure 6:
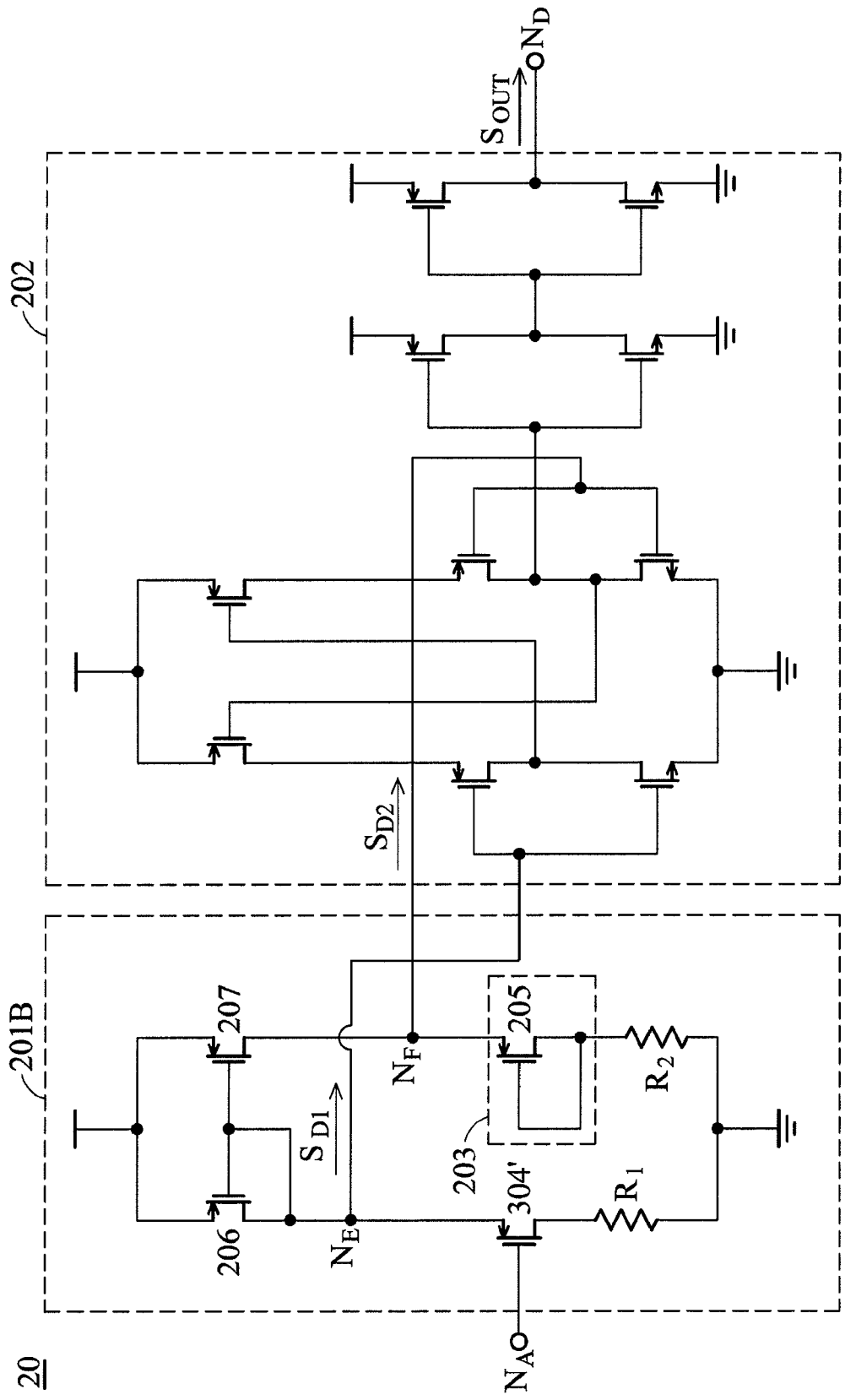
FIG. 6 shows a detailed circuit diagram of the level shifter according to FIG. 5.

FIG. 5 shows a circuit diagram of a first voltage adjusting circuit of FIG. 2 according to second embodiment. The difference between the second embodiment and the first embodiment of the invention is that the transistor 304 is connected between the current source $I_{1A}$, the small signal input terminal $N_A$ and the resistor $R_1$, but not connected to the ground, and the second input terminal of the second voltage adjusting circuit 202 is connected to a connection node $N_F$ of the current source $I_{1B}$ and the third voltage adjusting circuit 203. FIG. 6 shows a detailed circuit diagram of the level shifter according to FIG. 5. The transistor 304' is connected to the small signal input terminal $N_A$ for receiving the input signal $S_{IN}$. A source of the transistor 304' is connected to a drain of the transistor 206 at node $N_E$, and a drain of the transistor 304' is connected to the resistor $R_1$. Two input terminals of the second voltage adjusting circuit 202 are respectively connected to nodes $N_E$ and $N_F$ for respectively receiving the medium voltage (about 0V-4V) differential signals $S_{D1}$ and $S_{D2}$ output by the first voltage adjusting circuit 201B, and adjusting the voltages of the differential signals $S_{D1}$ and $S_{D2}$ so that the available voltage ranges of the output signal $S_{OUT}$ is about 0V-5V. The operations of the level shifters shown in FIG. 5 and FIG. 6 are similar to that of the level shifters shown in FIG. 3 and FIG. 4.

In order to increase the efficiency of a level shifter 20, the resistors $R_1$ and $R_2$ shown in FIGS. 3-6 may be replaced by another two current sources to increase the current flowing through the first voltage adjusting circuit 201. The driving capability of the level shifter 20 may thus be enhanced. The level shifter with two current source pairs will be illustrated in the following FIGS. 7-10.

Figure 7:
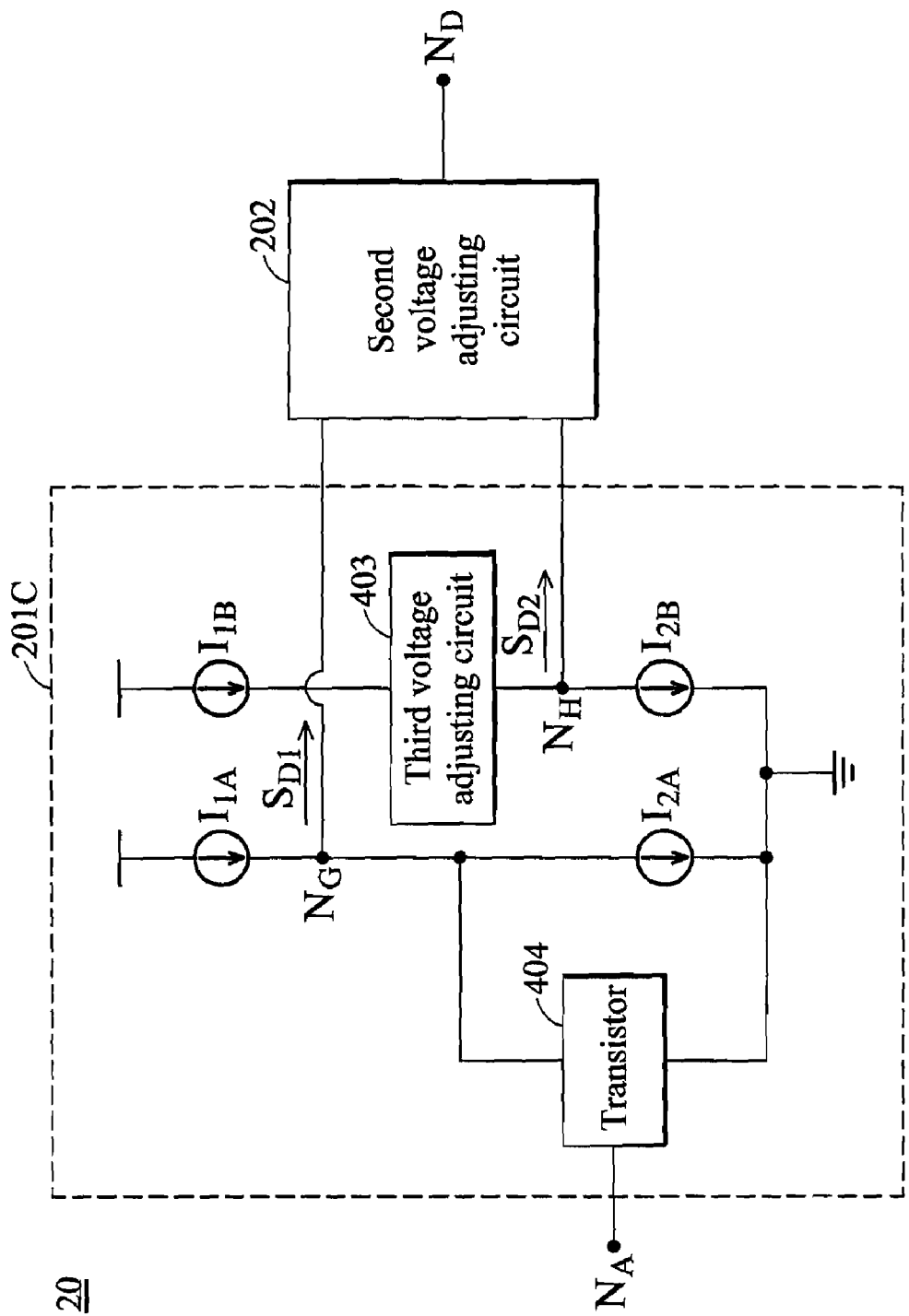
FIG. 7 shows a circuit diagram of a level shifter of FIG. 2 according to a third embodiment.

FIG. 7 shows a circuit diagram of a level shifter of FIG. 2 according to a third embodiment. The first voltage adjusting circuit 201C comprises four current sources $I_{1A}$, $I_{1B}$, $I_{2A}$ and $I_{2B}$, the third voltage adjusting circuit 403 and transistor 404. The third voltage adjusting circuit 403 is connected to the current source $I_{1B}$ for providing a voltage difference. The current source $I_{2A}$ is connected between the current source $I_{1A}$ and a ground for increasing the driving current of the first voltage adjusting circuit 201C. The current source $I_{2B}$ is connected between the third voltage adjusting circuit 403 and the ground. The transistor 404 is connected between the current source $I_{1A}$, the small signal input terminal $N_A$, the current source $I_{2A}$ and the ground for receiving the input signal $S_{IN}$.

Figure 8:
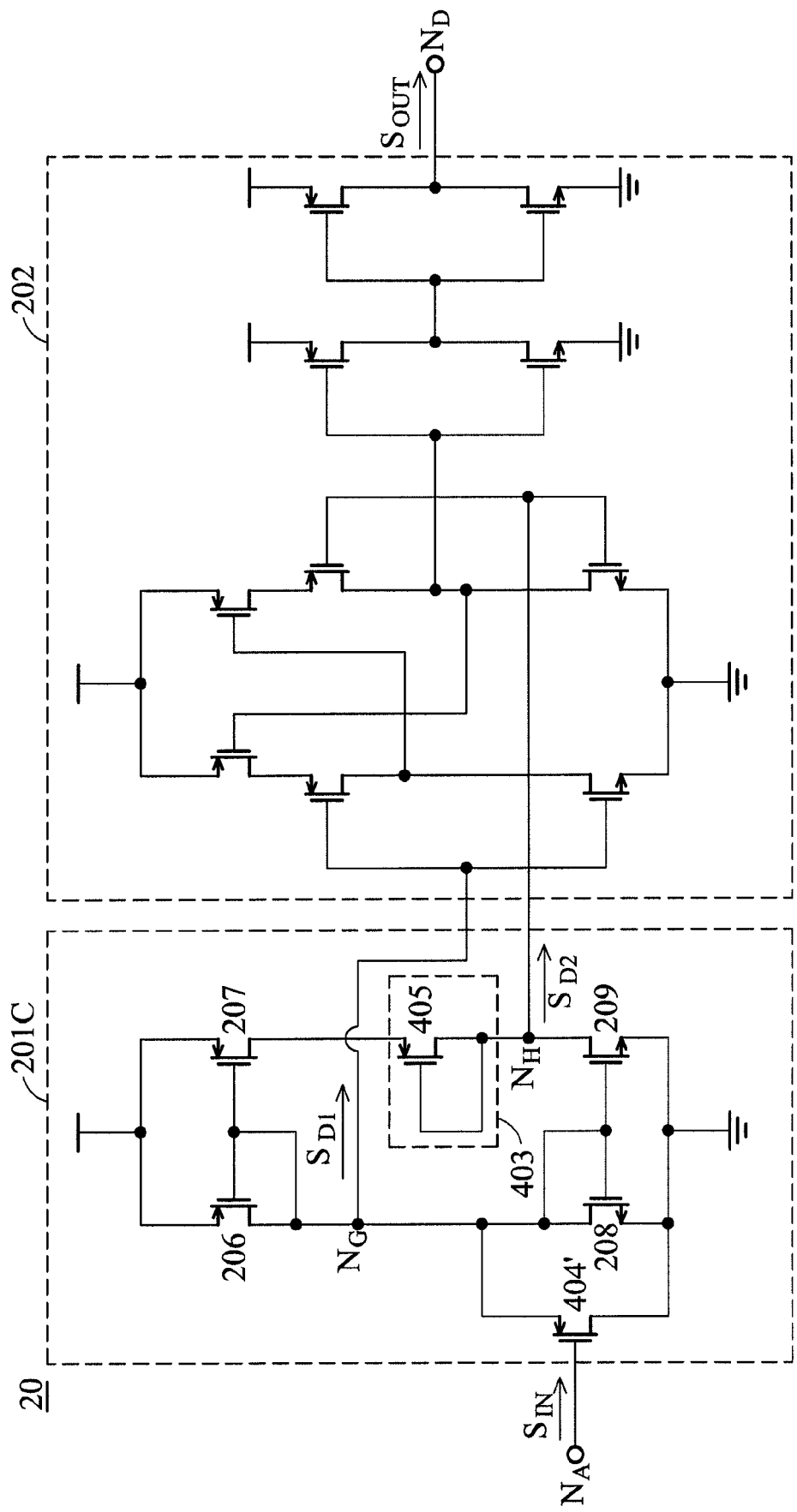
FIG. 8 shows the detailed circuit diagram of the level shifter according to FIG. 7.

Refer to both FIG. 7 and FIG. 8. FIG. 8 shows a detailed circuit diagram of the level shifter according to FIG. 7. According to the third embodiment of the invention, the transistor 404' may be a PMOS transistor. A gate of the transistor 404' is connected to the small signal input terminal $N_A$ for receiving the input signal $S_{IN}$, a source of the transistor 404' is coupled to a connection node $N_G$ of the current sources $I_{1A}$ and $I_{2A}$ (referring to FIG. 7), and a drain of the transistor 404' is coupled to the ground. The third voltage adjusting circuit 403 may be a PMOS transistor 405. A gate of the transistor 405 is connected to a drain thereof for providing a voltage difference between the source and drain of the transistor 405. However, according to the embodiments of the invention, the third voltage adjusting circuit 403 may also be a diode, an NMOS transistor with a gate connected to a drain for providing a voltage difference between two terminals of the third voltage adjusting circuit 403.

In the third embodiment of the invention, the current sources $I_{1A}$ and $I_{1B}$, and the current sources $I_{2A}$ and $I_{2B}$ respectively form two current mirrors as shown in FIG. 8. The current source $I_{1A}$ may be a PMOS transistor 206, the current source $I_{1B}$ may be a PMOS transistor 207, the current source $I_{2A}$ may be an NMOS transistor 208, and the current source $I_{2B}$ may be an NMOS transistor 209. A gate of the transistor 206 is connected to a gate of the transistor 207, and the gate of the transistor 206 is further coupled to a drain of the transistor 206 to form a first current mirror. A gate of the transistor 208 is connected to a gate of the transistor 209, and the gate of the transistor 208 is further connected to a drain of the transistor 208 to form a second current mirror. The first and second current mirrors may generate the corresponding currents for driving the first voltage adjusting circuit 201C according to the size of the transistors.

Two nodes $N_G$ and $N_H$ of the first voltage adjusting circuit 201C may output a pair of differential signals $S_{D1}$ and $S_{D2}$. Two input terminals of the second voltage adjusting circuit 202 are respectively connected to nodes $N_G$ and $N_H$ for receiving the medium voltage (about 0V-4V) differential signals $S_{D1}$ and $S_{D2}$. The second voltage adjusting circuit 202 may be a level shifter for receiving medium/high voltage (about 0V-4V) input signals and further adjusting the voltages of the received differential signals such that the available voltage range of the output signal may be about 0V-5V.

According to the embodiment of the invention, the first voltage adjusting circuit 201C may be an analog voltage adjusting circuit, where the transistors in the first voltage adjusting circuit 201C may be operated in saturation so that the first voltage adjusting circuit 201C may be used for receiving high frequency and low voltage input signals. Since the transistor 404 or 404' is designed as common drain, the voltage at node $N_G$ varies with the small input signal $S_{IN}$ received at node $N_A$. That is, according to the common source design of transistor 207 and the voltage difference provided by the third voltage adjusting circuit 403, when the input signal $S_{IN}$ is at logic high voltage (about 1.4V), the voltage at node $N_G$ may be raised to a logic high voltage to about 4V, and the voltage at node $N_H$ may be leveled down to a logic low voltage to about 0V. The transistor 206 here may be configured to provide DC bias and its corresponding current. When the input signal $S_{IN}$ is at logic low voltage (about 0V), the voltage at node $N_G$ may be leveled down to a logic low voltage to about 0V, and the voltage at node $N_H$ may be raised to a logic high voltage to about 4V. Thus, the nodes $N_G$ and $N_H$ may output the pair of differential signals $S_{D1}$ and $S_{D2}$ to about medium voltage range (about 0V-4V). And the differential signals $S_{D1}$ and $S_{D2}$ may be further output to the second voltage adjusting circuit 202 and level shifted by the voltage adjusting circuit 202 so that the available voltage range of the output signal $S_{OUT}$ may be adjusted to about 0V-5V.

Figure 9:
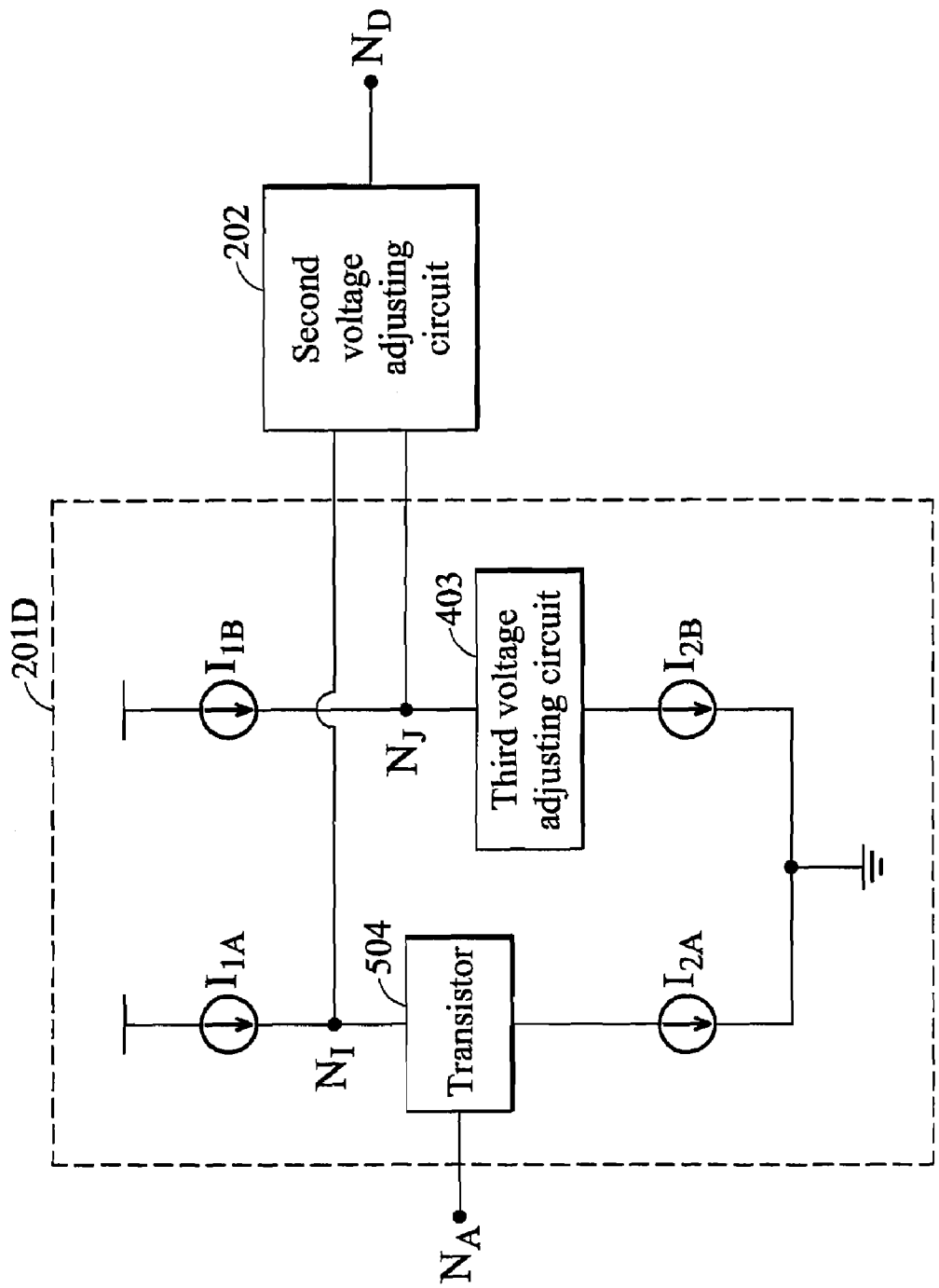
FIG. 9 shows a circuit diagram of level shifter of FIG. 2 according to a fourth embodiment of the invention.
Figure 10:
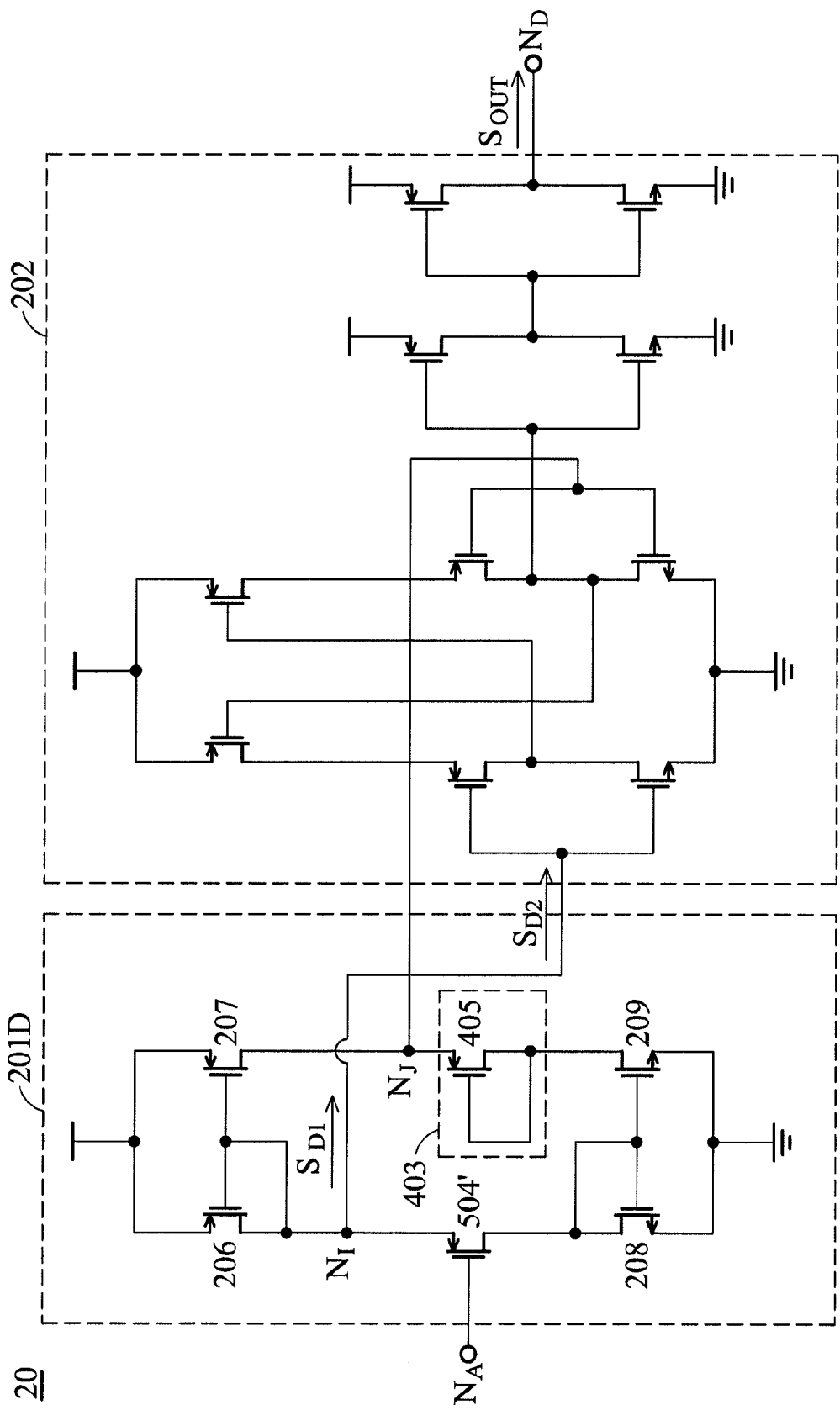
FIG. 10 shows a detailed circuit diagram of the level shifter according to FIG. 9.

FIG. 9 shows a circuit diagram of level shifter of FIG. 2 according to a fourth embodiment of the invention. The difference between the fourth embodiment and the third embodiment is that the transistor 504 is connected between the current source $I_{1A}$, the small signal input terminal $N_A$ and the current source $I_{2A}$, but not connected to the ground, and the second input terminal of the second adjusting circuit 202 is connected to a connection node $N_J$ of the current source $I_{1B}$ and the third voltage adjusting circuit 403. FIG. 10 shows a detailed circuit diagram of the level shifter according to FIG. 9. A gate of the transistor 504 is connected to the small signal input terminal $N_A$ for receiving the input signal $S_{IN}$, a source of the transistor 504 is coupled to a drain of the transistor 206 at node $N_I$, and a drain of the transistor 504 is coupled to the current source $I_{2A}$. Two input terminals of the second voltage adjusting circuit 202 are respectively connected to nodes $N_I$ and $N_J$ for respectively receiving the medium voltage (about 0V-4V) differential signals $S_{D1}$ and $S_{D2}$ output by the first voltage adjusting circuit 201D, and adjusting the voltage of the differential signals $S_{D1}$ and $S_{D2}$ so that the available voltage ranges of the output signal $S_{OUT}$ is about 0V-5V. The operations of the level shifters shown in FIG. 9 and FIG. 10 are similar to that of the level shifters shown in FIG. 7 and FIG. 8.

Figure 1:
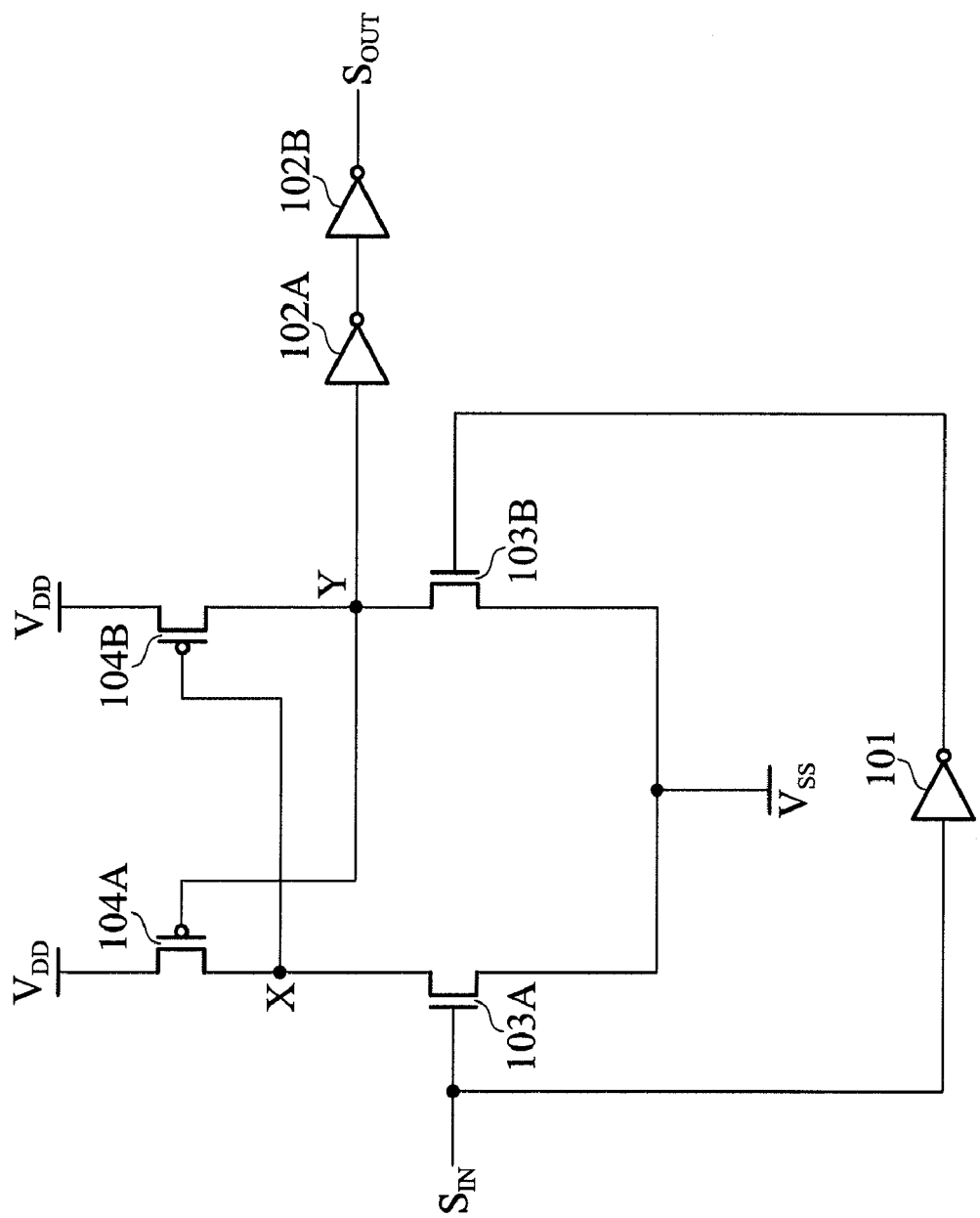
FIG. 1 shows a circuit diagram of a conventional digital level shifter.

Since in the conventional level shifter, the inner resistance and capacitance of the inverter for providing the differential signals (as the inverter 101 shown in FIG. 1) is large, thus, when receiving a low voltage and high frequency input signal, the inverter of the conventional level shifter needs to be implemented by larger size transistors to increase the driving current for responding to the variance of the low voltage and high frequency input signal in real-time. In this manner, both the circuit area and the power consumption are increased. However, according to the embodiments of the invention, the analog first voltage adjusting circuits 201 and 201A-201D are adopted here as a first stage of voltage adjusting circuits, which may respond in real-time to the variance of the low voltage and high frequency input signal via the small size transistors. Compared to the circuit size of the inverter in the conventional level shifter, the circuit area of the first voltage adjusting circuit may be reduced to about ⅛ of the conventional inverter. Furthermore, according to the embodiments of the invention, since a transistor 504 (or 504') is adopted at the input terminal of the level shifter, the input impendence of the level shifter is high and makes it easier to couple a former stage circuit.

Figure 11:
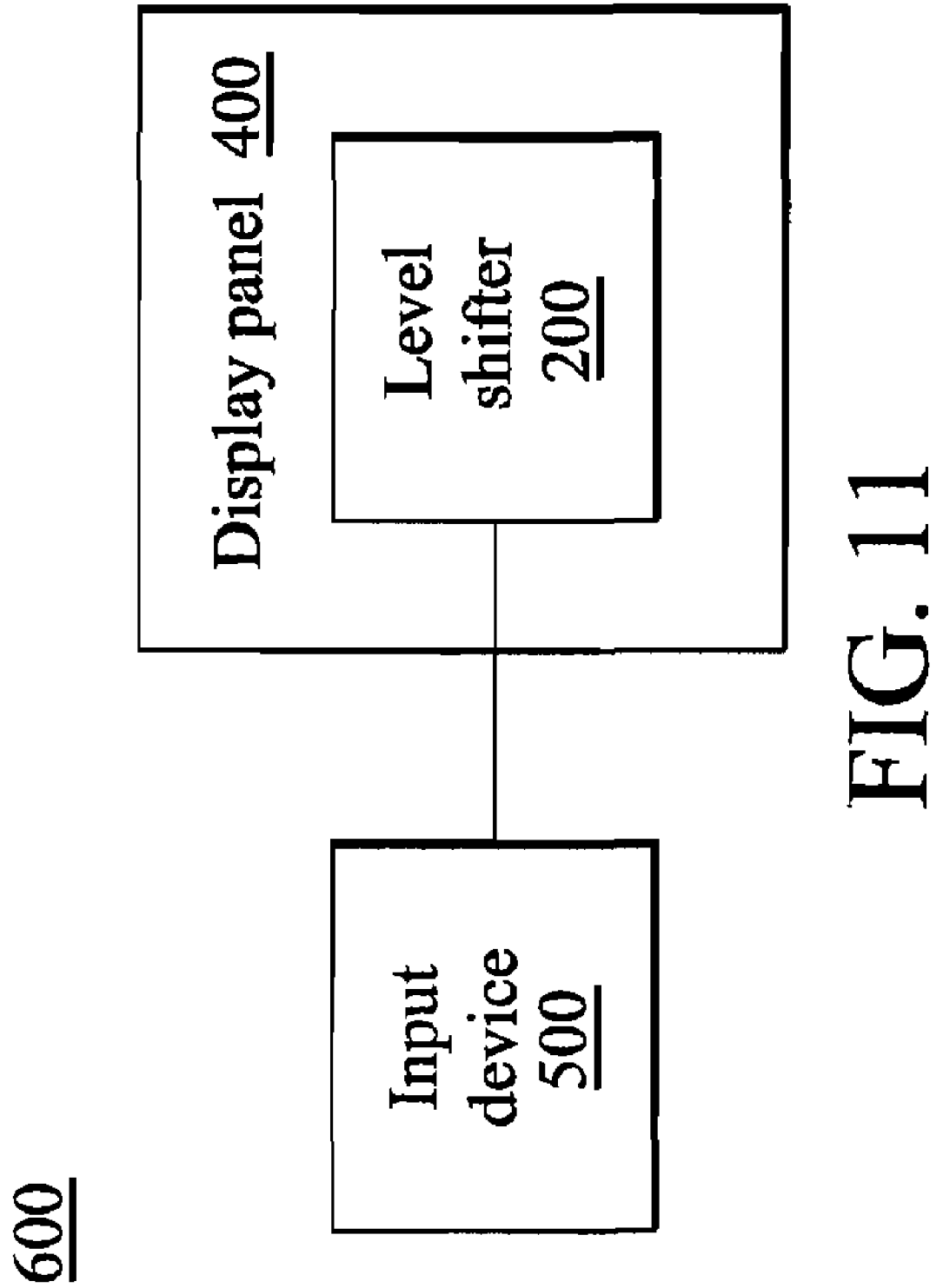
FIG. 11 shows a block diagram of an image display system according to a fifth embodiment of the invention.

FIG. 11 shows a block diagram of an image display system according to a fifth embodiment of the invention. According to the embodiment of the invention, the image display system may comprise a display panel 400 or an electrical device 600. As shown in FIG. 11, the display panel 400 may comprise the level shifter 200 developed according to the embodiments of the invention and may be a portion of the electrical device (such as the electrical device 600). An electrical device 600 generally comprises a display panel 400 and an input device 500. The input device 500 may further be connected to the display panel 400 and provide an image signal to the display panel 400 for displaying the image signal. The electrical device may be a mobile phone, a digital camera, a personal digital assistant (PDA), a lap-top computer, a personal computer, a television, a vehicle displayer, a global positioning system (GPS), an aviation displayer, a digital photo frame, or a portable DVD player.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An image display system, comprising:
   a level shifter, comprising:
   a first voltage adjusting circuit for adjusting the voltage of an input signal, which comprises a small signal input terminal receiving the input signal and a differential output terminal outputting a pair of differential signals, wherein voltage ranges of the differential signals are larger than that of the input signal; and
   a second voltage adjusting circuit coupled to the first voltage adjusting circuit, comprising a first input terminal and a second input terminal respectively receiving the pair of differential signals, wherein the second voltage adjusting circuit adjusts the voltage of the differential signals and generates an output signal, wherein a voltage range of the output signal is larger than that of the differential signals,
   wherein the first voltage adjusting circuit comprises:
   a first current source;
   a second current source;
   a third voltage adjusting circuit coupled to the second current source for providing a voltage difference;
   a first resistor coupled between the first current source and a ground;
   a second resistor coupled between the third voltage adjusting circuit and the ground; and
   a first transistor coupled to the first current source, the small signal input terminal, and the first resistor for receiving the input signal.

2. The image display system as claimed in claim 1, wherein a gate of the first transistor is coupled to the small signal input terminal for receiving the input signal, a source of the first transistor is coupled to a first connection node of the first current source and the first resistor, and a drain of the first transistor is coupled to the ground, and the first input terminal of the second voltage adjusting circuit is coupled to the first connection node, and the second input terminal of the second voltage adjusting circuit is coupled to a second connection node of the third voltage adjusting circuit and the second resistor.

3. The image display system as claimed in claim 1, wherein a gate of the first transistor is coupled to the small signal input terminal for receiving the input signal, a source of the first transistor is coupled to the first current source, and a drain of the first transistor is coupled to the first resistor, and the first input terminal of the second voltage adjusting circuit is coupled to a third connection node of the first transistor and the first current source, and the second input terminal of the second voltage adjusting circuit is coupled to a fourth connection node of the third voltage adjusting circuit and the second current source.

4. The image display system as claimed in claim 1, wherein the first transistor is a first PMOS transistor.

5. The image display system as claimed in claim 1, wherein the third voltage adjusting circuit is a diode.

6. The image display system as claimed in claim 1, wherein the third voltage adjusting circuit is a MOS transistor, wherein a gate of the MOS transistor is coupled to a drain of the MOS transistor.

7. The image display system as claimed in claim 1, wherein the first current source and the second current source form a first current mirror, and the first current source is a second PMOS transistor, the second current source is a third PMOS transistor, and wherein a gate of the second PMOS transistor is coupled to a gate of the third PMOS transistor, and the gate of the second PMOS transistor is further coupled to a drain of the second PMOS transistor.

8. The image display system as claimed in claim 1, further comprising a display panel, wherein the level shifter is in the display panel.

9. The image display system as claimed in claim 8, further comprising an electrical device, wherein the electrical device comprising:
   the display panel; and
   an input device coupled to the display panel and providing an image signal to the display panel for displaying the image signal.

10. The image display system as claimed in claim 9, wherein the electrical device is a mobile phone, a digital camera, a personal digital assistant (PDA), a lap-top computer, a personal computer, a television, a vehicle displayer, a global positioning system (GPS), an aviation displayer, a digital photo frame, or a portable DVD player.

11. An image display system, comprising:
    a level shifter, comprising:
    a first voltage adjusting circuit for adjusting the voltage of an input signal, which comprises a small signal input terminal receiving the input signal and a differential output terminal outputting a pair of differential signals, wherein voltage ranges of the differential signals are larger than that of the input signal; and
    a second voltage adjusting circuit coupled to the first voltage adjusting circuit, comprising a first input terminal and a second input terminal respectively receiving the pair of differential signals, wherein the second voltage adjusting circuit adjusts the voltage of the differential signals and generates an output signal, wherein a voltage range of the output signal is larger than that of the differential signals,
    wherein the first voltage adjusting circuit comprises:
    a first current source;
    a second current source;
    a third voltage adjusting circuit coupled to the second current source for providing a voltage difference;
    a third current source coupled between the first current source and a ground;
    a fourth current source coupled between the third voltage adjusting circuit and the ground; and
    a first transistor coupled between the first current source, the small signal input terminal and the third current source for receiving the input signal.

12. The image display system as claimed in claim 11, wherein a gate of the first transistor is coupled to the small signal input terminal for receiving the input signal, a source of the first transistor is coupled to a fifth connection node of the first current source and the third current source, and a drain of the first transistor is coupled to the ground, and the first input terminal of the second voltage adjusting circuit is coupled to the fifth connection node, and the second input terminal of the second voltage adjusting circuit is coupled to a sixth connection node of the third voltage adjusting circuit and the fourth current source.

13. The image display system as claimed in claim 11, wherein a gate of the first transistor is coupled to the small signal input terminal for receiving the input signal, a source of the first transistor is coupled to the first current source, and a drain of the first transistor is coupled to the third current source, and the first input terminal of the second voltage adjusting circuit is coupled to a sixth connection node of the first transistor and the first current source, and the second input terminal of the second voltage adjusting circuit is coupled to a seventh connection node of the third voltage adjusting circuit and the second current source.

14. The image display system as claimed in claim 11, wherein the first transistor is a first PMOS transistor.

15. The image display system as claimed in claim 11, wherein the third voltage adjusting circuit is a MOS transistor, wherein a gate of the MOS transistor is coupled to a drain of the MOS transistor.

16. The image display system as claimed in claim 11, wherein the first current source and the second current source form a first current mirror.

17. The image display system as claimed in claim 16, wherein the first current source is a second PMOS transistor, the second current source is a third PMOS transistor, and wherein a gate of the second PMOS transistor is coupled to a gate of the third PMOS transistor, and the gate of the second PMOS transistor is further coupled to a drain of the second PMOS transistor.

18. The image display system as claimed in claim 17, wherein the third current source is a fourth PMOS transistor, the fourth current source is a fifth PMOS transistor, and wherein a gate of the fourth PMOS transistor is coupled to a gate of the fifth PMOS transistor, and the gate of the fourth PMOS transistor is further coupled to a drain of the fourth PMOS transistor.

19. The image display system as claimed in claim 11, wherein the third current source and the fourth current source form a second current mirror.

* * * * *